(12) United States Patent
Mori

(10) Patent No.: US 12,288,970 B2
(45) Date of Patent: Apr. 29, 2025

(54) ELECTRICAL CONNECTION BOX

(71) Applicant: Sumitomo Wiring Systems, Ltd., Yokkaichi (JP)

(72) Inventor: Asuka Mori, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 18/264,024

(22) PCT Filed: Jan. 18, 2022

(86) PCT No.: PCT/JP2022/001550
§ 371 (c)(1),
(2) Date: Aug. 2, 2023

(87) PCT Pub. No.: WO2022/168598
PCT Pub. Date: Aug. 11, 2022

(65) Prior Publication Data
US 2024/0305080 A1 Sep. 12, 2024

(30) Foreign Application Priority Data
Feb. 4, 2021 (JP) ................................. 2021-016271

(51) Int. Cl.
*B60R 16/03* (2006.01)
*H02G 3/14* (2006.01)
(Continued)

(52) U.S. Cl.
CPC .................. *H02G 3/14* (2013.01); *H02G 3/16* (2013.01); *B60R 16/03* (2013.01); *H02G 3/088* (2013.01)

(58) Field of Classification Search
CPC .................................................. B60R 16/0239
See application file for complete search history.

(56) References Cited

U.S. PATENT DOCUMENTS 10,305,267 B2 * 5/2019 Kawada .............. B60R 16/0238
2008/0149387 A1    6/2008 Oda
(Continued)

FOREIGN PATENT DOCUMENTS

JP    S64-040224 U   3/1989
JP    2001-045630 A  2/2001
(Continued)

OTHER PUBLICATIONS

International Search Report, Application No. PCT/JP2022/001550, mailed Mar. 8, 2022. ISA/Japan Patent Office.

*Primary Examiner* — Hung V Ngo
(74) *Attorney, Agent, or Firm* — Honigman LLP

(57) ABSTRACT

An electrical connection box includes a busbar, a box main body in which the busbar is provided, and a cover that covers the box main body. The cover has an engaging part. The box main body has an engaged part that is engaged with the engaging part to combine the box main body and the cover. A recessed part is formed in an outer peripheral wall of a unit that is formed by combining the box main body and the cover. The recessed part houses a lock part that is formed by engagement between the engaging part and the engaged part. The recessed part has a depth dimension with which the lock part is positioned closer to a central side of the unit than an end surface of the outer peripheral wall.

11 Claims, 8 Drawing Sheets

(51) Int. Cl.
*H02G 3/16* (2006.01)
*H02G 3/08* (2006.01)

(56) References Cited

U.S. PATENT DOCUMENTS

| | | | |
|---|---|---|---|
| 2021/0203144 A1* | 7/2021 | Akiba | H05K 7/20854 |
| 2023/0047395 A1* | 2/2023 | Darr | B60R 16/0238 |
| 2023/0117716 A1* | 4/2023 | Wada | H05K 5/0217 |
| | | | 361/679.01 |

FOREIGN PATENT DOCUMENTS

| | | |
|---|---|---|
| JP | 2013-074681 A | 4/2013 |
| JP | 2019-004639 A | 1/2019 |

* cited by examiner

ELECTRICAL CONNECTION BOX

CROSS-REFERENCE TO RELATED APPLICATIONS

This application is the U.S. national stage of PCT/JP2022/001550 filed on Jan. 18, 2022, which claims priority of Japanese Patent Application No. JP 2021-016271 filed on Feb. 4, 2021, the contents of which are incorporated herein.

TECHNICAL FIELD

The present disclosure relates to an electrical connection box.

BACKGROUND

Electrical connection boxes (also called "junction boxes") are used in industrial products such as automobiles, for example. Such an electrical connection box is used to connect power source devices, in-vehicle devices, or external devices such as other electrical connection boxes to supply power. For example, in order to supply power from a battery to a plurality of in-vehicle devices, an electric wire extending from the battery is first connected to an electrical connection box, and electric wires extending from the electrical connection box are connected to the in-vehicle devices. The electrical connection box includes a box main body in which busbars are provided and a cover (see JP 2008-154412 A, for example).

In an electrical connection box, the box main body in which the busbars are provided is covered by the cover. In order to combine the cover and the box main body, the cover has an engaging part that is formed by a claw or the like at a predetermined place. The box main body has an engaged part with which the engaging part engages. The engaging part is provided at a predetermined place on an outer peripheral wall of the cover.

The electrical connection box is attached to a portion of the body frame of an automobile, for example. Thus, other cables are routed or other components are provided in the surrounding region of the electrical connection box. Accordingly, the electrical connection box is provided so as not to protrude outward in the slightest, and the entire electrical connection box desirably falls within a required space.

Conventionally, the lock part is formed by engagement between the engaging part and the engaged part and is provided so as to protrude outward from a portion of the outer peripheral wall of the cover. Since the automobile vibrates during travel, vibration may cause the cables or other members in the surrounding region of the electrical connection box to interfere with the lock part protruding outward. For example, if a cable comes into contact with the lock part, the lock part may become disengaged due to the contact.

In view of this, an object of the preset disclosure is to provide an electrical connection box that can make the surrounding cables unlikely to be caught on the lock part formed by engagement between the engaging part and the engaged part, and make the surrounding members unlikely to interfere with the lock part.

SUMMARY

An electrical connection box according to an aspect of the present disclosure includes a busbar, a box main body in which the busbar is provided, and a cover that covers the box main body. The cover has an engaging part. The box main body has an engaged part that is engaged with the engaging part to combine the box main body and the cover. A recessed part is formed in an outer peripheral wall of a unit that is formed by combining the box main body and the cover. The recessed part houses a lock part that is formed by engagement between the engaging part and the engaged part. The recessed part has a depth dimension with which the lock part is positioned closer to a central side of the unit than an end surface of the outer peripheral wall.

Advantageous Effect

According to the present disclosure, the cables around the electrical connection box are unlikely to be caught on the lock part and the members around the electrical connection box are unlikely to interfere with the lock part.

DETAILED DESCRIPTION OF PREFERRED EMBODIMENTS

Figure 1:
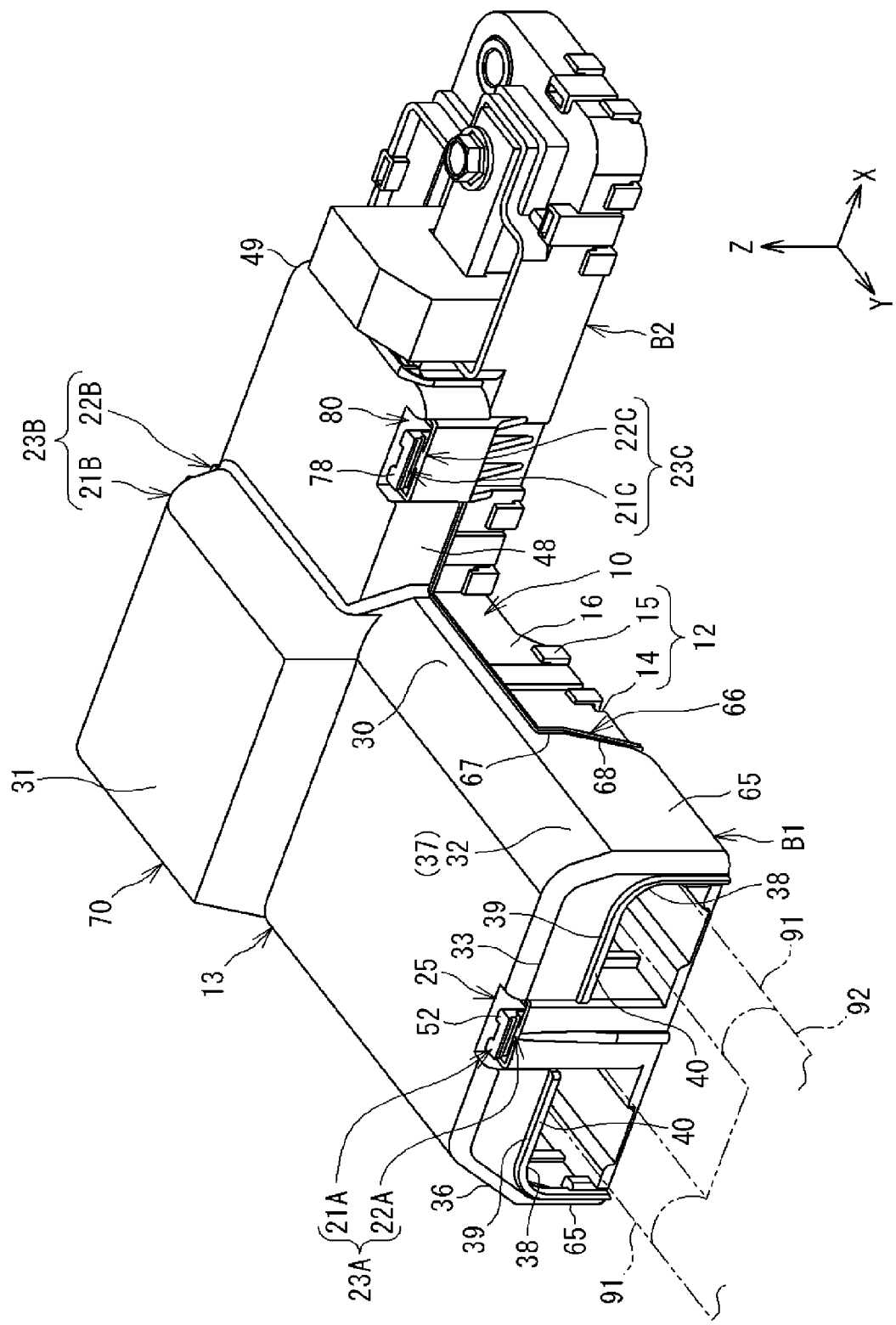
FIG. 1 is a perspective view of an electrical connection box according to an embodiment.

Hereinafter, outlines of embodiments of the present disclosure will be listed and described.

An electrical connection box of the present embodiment includes a busbar, a box main body in which the busbar is provided, and a cover that covers the box main body. The cover has an engaging part. The box main body has an engaged part that is engaged with the engaging part to combine the box main body and the cover. A recessed part is formed in an outer peripheral wall of a unit that is formed by combining the box main body and the cover. The recessed part houses a lock part that is formed by engagement between the engaging part and the engaged part. The recessed part has a depth dimension with which the lock part is positioned closer to a central side of the unit than an end surface of the outer peripheral wall.

According to the electrical connection box in the present embodiment, the recessed part is formed in the outer peripheral wall of the unit that is formed by combining the box main body and the cover. The lock part is housed in the recessed part, and the lock part does not protrude from the end surface of the outer peripheral wall. This makes the cables around the electrical connection box unlikely to be caught on the lock part and makes the members around the electrical connection box unlikely to interfere with the lock part.

The lock part is preferably configured to displace the engaging part toward the central side of the unit in order to disengage the engaging part and the engaged part, and the recessed part has a depth dimension that is greater than a dimension by which the engaging part is displaced for the disengagement. According to this configuration, it is possible to disengage the engaging part and the engaged part within a range of the recessed part.

The recessed part preferably has a width dimension that enables insertion of a person's fingertip. According to this configuration, it is possible to disengage the engaging part and the engaged part without using a tool.

An opening that enables passage of two cables is preferably formed on two sides of the recessed part in a portion of the outer peripheral wall, such that the two cables extend from the portion of the outer peripheral wall provided with the recessed part in a direction in which the portion of the outer peripheral wall is oriented. In this case, if a component such as a protector is attached to the two cables, for example, the component and the lock part are unlikely to interfere with each other. Forming the opening that allows passage of the two cables on two sides of the recessed part allows the two cables and the recessed part to be arranged in a spatially efficient manner.

The cover preferably has a rib that protrudes from the outer peripheral wall provided with the opening and is provided along the opening, and a leading end surface of the rib is the end surface. In this case, the rib enhances the rigidity of the outer peripheral wall and also serves as an overhang to improve the waterproofness of the cover. The depth of the recessed part is set such that the lock part is positioned closer to the central side of the unit than the leading end surface of the rib, that is, such that the lock part does not protrude from the leading end surface of the rib.

At least a portion of the lock part preferably protrudes toward the outside of the unit past the wall surface of the outer peripheral wall. In this case, if an operator tries to remove the cover from the box main body in an environment where the lock part is not visible, for example, the operator can easily access the lock part by moving fingers along a wall surface of the outer peripheral wall, and thus perform work with efficiency.

If the cover covers the box main body from above, the box main body preferably has a guide part that guides the cover when the cover is brought close to and is attached to the box main body from above. The engaging part and the engaged part are preferably configured to be relatively displaced for engagement in a direction orthogonal to an up-down direction. A direction in which the guide part guides the cover preferably has a component of a direction orthogonal to the up-down direction. In this case, putting the cover on the box main body while the cover is guided by the guide part engages the engaging part and the engaged part with each other.

Details of Embodiments of Present Disclosure

Hereinafter, embodiments of the present disclosure will be described in detail with reference to the drawings. At least some of the embodiments described below may be combined in any manner.

An electrical connection box 10 in the present embodiment (see FIG. 1) is mounted in an automobile, for example, and is used at an intermediate position of a path for supplying power from an in-vehicle battery to a plurality of in-vehicle devices. The electrical connection box 10 in the present embodiment can also be said to be a relay electrical connection box. The electrical connection box 10 is fixed to the body frame of the automobile, for example.

Overall Configuration of Electrical Connection Box 10

Figure 2:
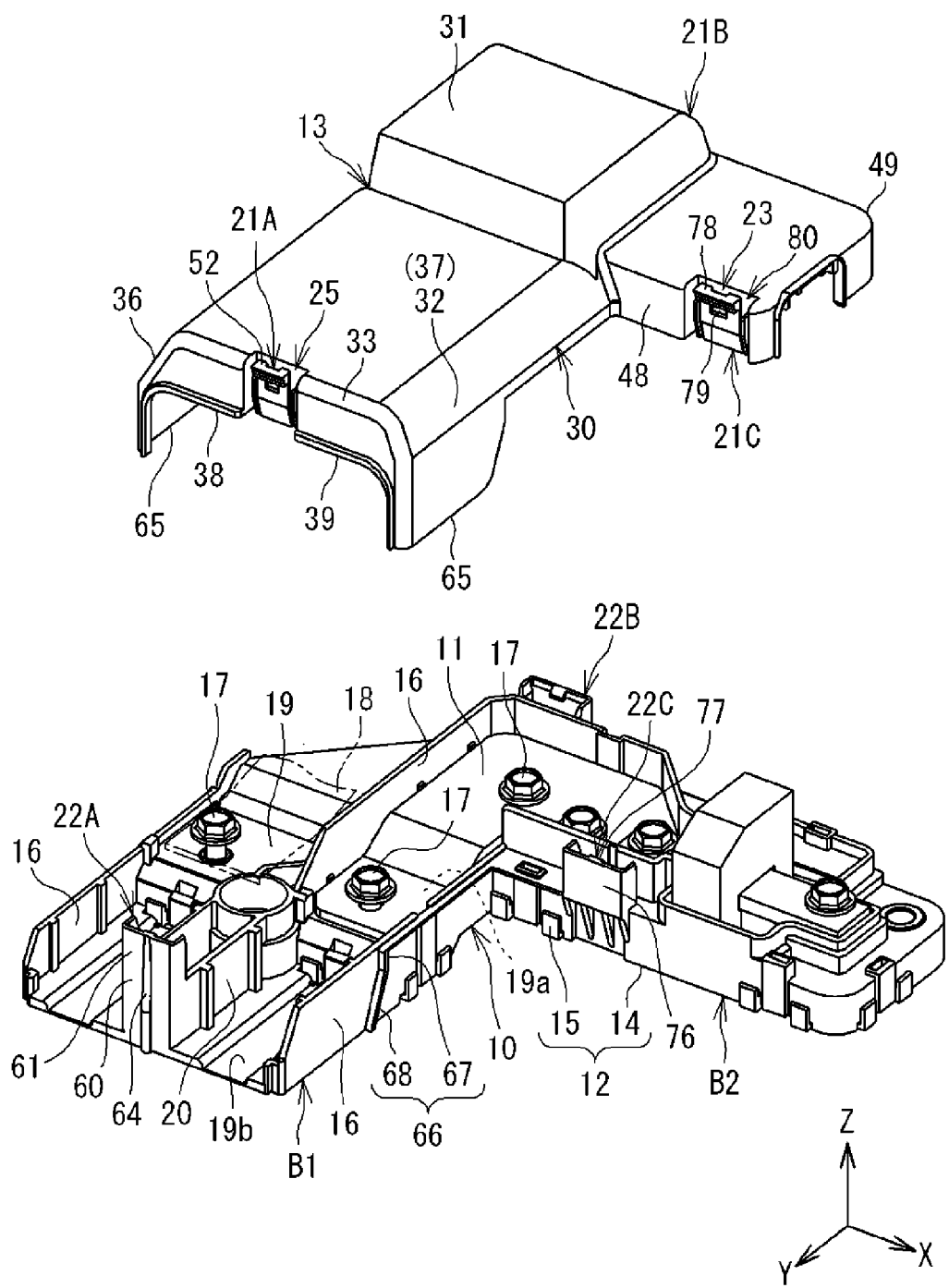
FIG. 2 is an exploded perspective view of the electrical connection box shown in FIG. 1.

FIG. 1 is a perspective view of the electrical connection box 10 according to the present embodiment. In FIG. 1, wire harnesses (cables) 91 for connection to external devices are indicated with virtual lines (two-dot chain lines). The wire harnesses 91 are provided with a protector 92 that is also indicated by a virtual line (two-dot chain line) in FIG. 1. FIG. 2 is an exploded perspective view of the electrical connection box 10 shown in FIG. 1. The electrical connection box 10 includes a busbar 11, a box main body 12 in which the busbar 11 is provided, and a cover 13 that covers the box main body 12. The box main body 12 and the cover 13 are combined by engagement between engaging parts 21A, 21B, 21C and engaged parts 22A, 22B, 22C described later. A structure obtained by combining the box main body 12 and the cover 13 will be referred to as a "unit 70".

In regards to the electrical connection box 10 of the present disclosure, the up-down direction, front-back direction, and left-right directions will be defined. The electrical connection box 10 has a box shape that is flat as a whole, although it has some projections and depressions. The flatness direction, that is, the direction in which the electrical connection box 10 is thin is defined as the up-down direction. The electrical connection box 10 shown in FIGS. 1 and 2 has a first block B1 that has a first direction serving as a longitudinal direction, and a second block B2 that has a second direction serving as a longitudinal direction intersecting (orthogonal to) the first direction. When viewed from above, the electrical connection box 10 has an almost L shape. In the present disclosure, the first direction is defined as the front-back direction, and the second direction is defined as the left-right direction.

As shown in FIG. 1, the two wire harnesses 91 extend linearly from the first block B1, and the direction in which the two wire harnesses 91 extend is the forward direction. The direction in which the two wire harnesses 91 are aligned side by side is the left-right direction. The direction in which the second block B2 extends from the rear portion side of the first block B1 is the rightward direction. The cover 13 covers the box main body 12 from above. XYZ coordinates are shown in the drawings. The Z direction is the direction from bottom to top (the up-down direction), the Y direction is the front-back direction (the direction from back to front), and the X direction is the left-right direction (the direction from left to right).

The box main body 12 has a first case (upper case) 14 and a second case (lower case) 15. FIG. 2 shows the first case 14 and the second case 15 coupled to each other. A main busbar 11 is provided between the first case 14 and the cover 13. A sub-busbar (not shown) is provided between the first case 14 and the second case 15. The second case 15 covers the first case 14 from below. The cover 13 covers the first case 14 from above.

The first case 14, the second case 15, and the cover 13 are made of a synthetic resin, and are molded using injection molding. The first case 14 has a bottom plate part 19 on which the busbar 11 and the like are placed. The bottom plate part 19 has a stepped shape with a height difference in the up-down direction. The busbar 11 is disposed in a first region 19a of the bottom plate part 19, and an end portion of the wire harness 91 (see FIG. 1) connected to the busbar 11 is provided in a second region 19b of the bottom plate part 19.

At portions of the first case 14, side plate parts 16 extend upward from the bottom plate part 19. The first case 14 is open upward as a whole. The busbar 11 (the first busbar 11) is provided between the pair of opposing side plate parts 16.

In the present embodiment, in addition to the first busbar 11, a second busbar 18 indicated by a two-dot chain line is provided. The first busbar 11 is formed in an almost L shape as viewed from above, in accordance with the shape of the box main body 12. The shapes of the electrical connection box 10 (the box main body 12) and the busbar 11 can be freely changed and may take a shape other than an L shape.

The first busbar 11 and the second busbar 18 are attached to the box main body 12 by bolts 17. A terminal of one of the wire harnesses 91 shown in FIG. 1 is connected to an end portion of the busbar 11. A terminal of the other wire harness 91 shown in FIG. 1 is connected to an end portion of the second busbar 18. The terminals of the wire harnesses 91 and the busbars 11 (18) are fastened to each other by the bolts 17.

The cover 13 is detachably attached to the box main body 12. In order to attach the cover 13 to the box main body 12, the cover 13 has a plurality of engaging parts, and the box main body 12 has engaged parts that are to be engaged with the engaging parts. In the present embodiment, the cover 13 has three engaging parts 21A, 21B, and 21C, and the box main body 12 has the same number of (three) engaged parts 22A, 22B, and 22C as the engaging parts.

The first engaging part 21A and the first engaged part 22A are provided on the front side of the first block B1. The first engaging part 21A and the first engaged part 22A form a "first lock part 23A" (see FIG. 1). The second engaging part 21B and the second engaged part 22B are provided on the back side of the first block B1. The second engaging part 21B and the second engaged part 22B form a "second lock part 23B". The third engaging part 21C and the third engaged part 22C are provided on the front side of the second block B2. The third engaging part 21C and the third engaged part 22C form a "third lock part 23C".

When the three engaging parts 21A, 21B, 21C and the three engaged parts 22A, 22B, 22C are respectively engaged with each other, the box main body 12 and the cover 13 are combined in a non-separatable manner. When these parts are all disengaged, the box main body 12 and the cover 13 are separated from each other.

The cover 13 has a cover main body 31 that covers the box main body 12 from above, and an outer peripheral wall 30 that covers the busbars 11 and 18 of the box main body 12 from the right and left sides or the front and back sides. The outer peripheral wall 30 has cover-side walls 32 and a cover front wall 33. The cover-side walls 32 include a first side wall part 36 and a second side wall part 37 on the right and left sides, and include a third side wall part 48 on the front side and a fourth side wall part 49 on the back side 2, the first side wall part 36 and the second side wall part 37 being included in the first block B1 and the third side wall part 48 and the fourth side wall part 49 being included in the second block B2. The cover front wall 33 is continuous with the front end portion of the cover main body 31, and is provided between the first side wall part 36 and the second side wall part 37.

The cover front wall 33 is provided with a recessed part 25. The recessed part 25 has a groove shape that is open forward and whose groove longitudinal direction thereof matches the up-down direction. The cover front wall 33 is partitioned between the right and left sides by the recessed part 25. The cover front wall 33 is provided with an opening 38 such that the two wire harnesses 91 and 91 can extend from the cover front wall 33 in a direction in which the cover front wall 33 is oriented, that is, in the forward direction. The opening 38 is formed on the right and left sides of the recessed part 25, and allows passage of the two wire harnesses 91 and 91 (see FIG. 1).

The cover 13 has wall-like extension parts 65 that respectively extend downward from the first side wall part 36 and the second side wall part 37 in the first block B1.

Figure 3:
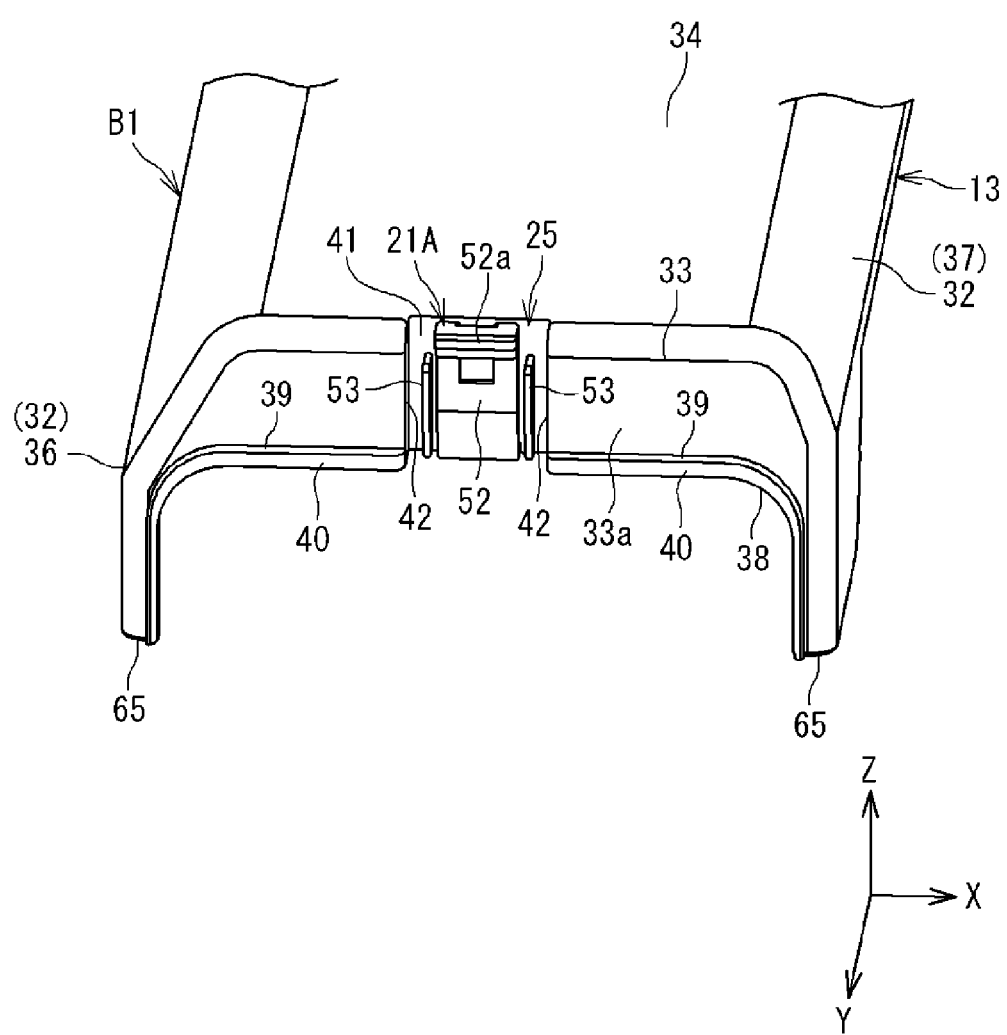
FIG. 3 is a perspective view of the front side of a first block.

FIG. 3 is a perspective view of the front side of the first block B1. The cover front wall 33 has ribs 39 that are provided along the opening 38. The ribs 39 are provided on the right and left sides of the recessed part 25. The ribs 39 are provided extending from the cover front wall 33 across the right and left extension parts 65. The ribs 39 protrude forward from a front wall surface 33a of the cover front wall 33. The front wall surface 33a has a shape extending along a plane orthogonal to the front-back direction. The height of the ribs 39 protruding forward from the front wall surface 33a of the cover front wall 33 is constant along the ribs 39.

The ribs 39 can enhance the rigidity of the cover front wall 33. The ribs 39 function as overhangs. The ribs 39 are provided on the upper part and right and left side parts of the opening 38 so as to extend along the opening 38. Accordingly, water droplets dripping from the upper surface of the cover 13 to the cover front wall 33 flow along the ribs 39 and are unlikely to enter the opening 38. With the cover 13 having the ribs 39, it is possible to increase the waterproofness of the electrical connection box 10.

About First Engaging Part 21A of Cover 13

In FIG. 3, the recessed part 25 has a bottom surface 41 that is positioned rearward of the cover front wall 33, and right and left side surfaces 42 and 42 that extend forward from the right and left sides of the bottom surface 41. The side surfaces 42 are connected to the front wall surface 33a of the cover front wall 33.

Figure 4:
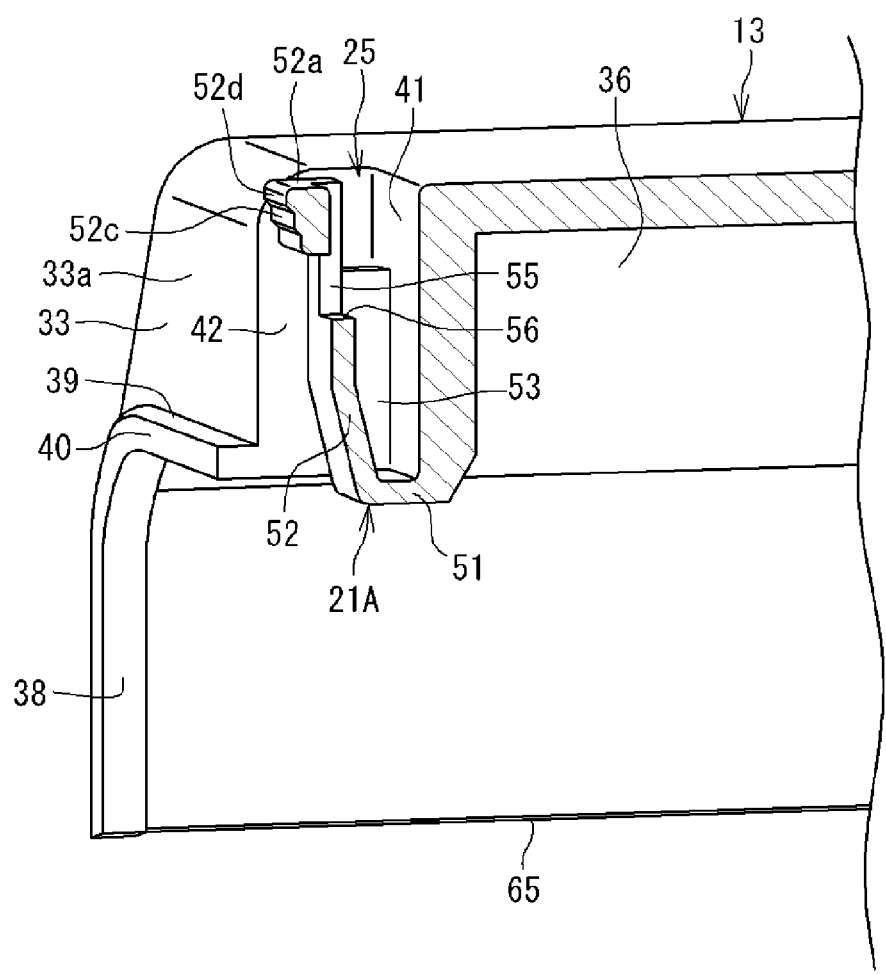
FIG. 4 is a cross-sectional view of a first engaging part of a cover.
Figure 4:
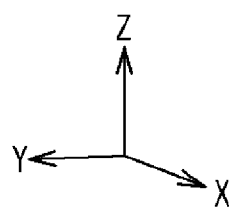

FIG. 4 is a cross-sectional view of the first engaging part 21A of the cover 13. The cover 13 has, as the first engaging part 21A, a coupling piece part 51 that protrudes forward from the bottom surface 41 of the recessed part 25 and an engaging piece part 52 that extends upward from the front end of the coupling piece part 51. The coupling piece part 51 and the engaging piece part 52 are not in contact with the side surfaces 42 of the recessed part 25, and the coupling piece part 51 is elastically deformable toward the bottom surface 41 rearward thereof.

The engaging piece part 52 has an operation part 52a at the leading end (upper end) thereof. The operation part 52a has, on the front side, a stepped operation surface 52c that extends forward with increasing proximity to the leading end (upper end) of the engaging piece part 52. The operation surface 52c includes a foremost end surface 52d that is positioned forward relative to the wall surface 33a of the cover front wall 33. The engaging piece part 52 has a hole 55 that extends through the engaging piece part 52 in the front-back direction. The hole 55 is positioned below the operation part 52a.

About First Engaged Part 22A of Box Main Body 12

As shown in FIG. 2, the first case 14 of the box main body 12 has a column part 60 serving as the first engaged part 22A. The column part 60 is provided at the front end portion of the first block B1. The column part 60 extends upward between the right and left side plate parts 16 from the bottom plate part 19 (the second region 19b) of the first case 14. A central wall part 20 is also provided on the front side of the first block B1 between the right and left side plate parts 16. The central wall part 20 and the column part 60 are connected to each other.

The space between the left side plate part 16 and the central wall part 20 forms a housing space where the end portion of the one wire harness 91 (see FIG. 1) is positioned.

The space between the right side plate part 16 and the central wall part 20 forms a housing space where the end portion of the other wire harness 91 (see FIG. 1) is positioned. These housing spaces are covered by the cover 13.

Figure 5:
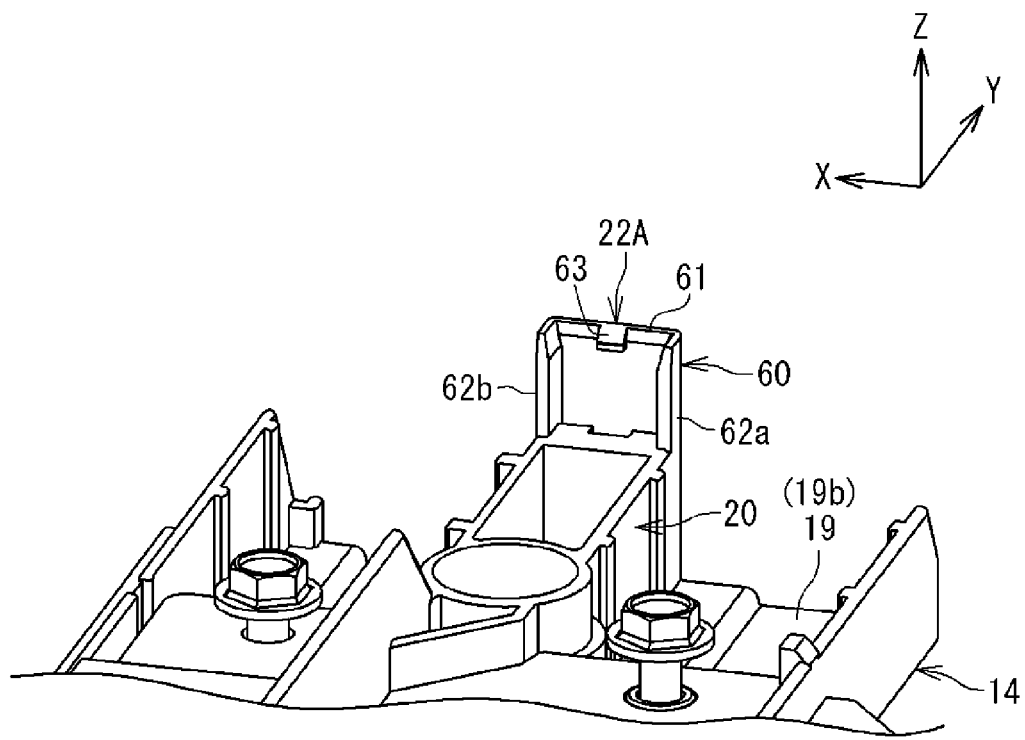
FIG. 5 is a perspective view of a first engaged part and the surrounding region thereof as seen from the rear side.

FIG. 5 is a perspective view of the rear side of the first engaged part 22A (the column part 60) and the surrounding region thereof. The column part 60 has a flat plate-shaped front part 61 that extends upward from the bottom plate part 19, a flat plate-shaped side part 62a that extends rearward from the left end portion of the front part 61, and a flat plate-shaped side part 62b that extends rearward from the right end portion of the front part 61.

The front part 61 has a projection 63 that protrudes backward at the leading end (upper end) thereof. The side parts 62a and 62b function as members that enhance the rigidity of the front part 61. The column part 60 including the front part 61 is restricted from deforming in the front-back direction, the left-right direction, and the up-down direction. As shown in FIG. 2, the front part 61 has, on the front side thereof, a protruding part 64 that extends in the up-down direction. The protruding part 64 can enhance the rigidity of the front part 61, and the column part 60 including the front part 61 is particularly unlikely to deform in the front-back direction.

Figure 6:
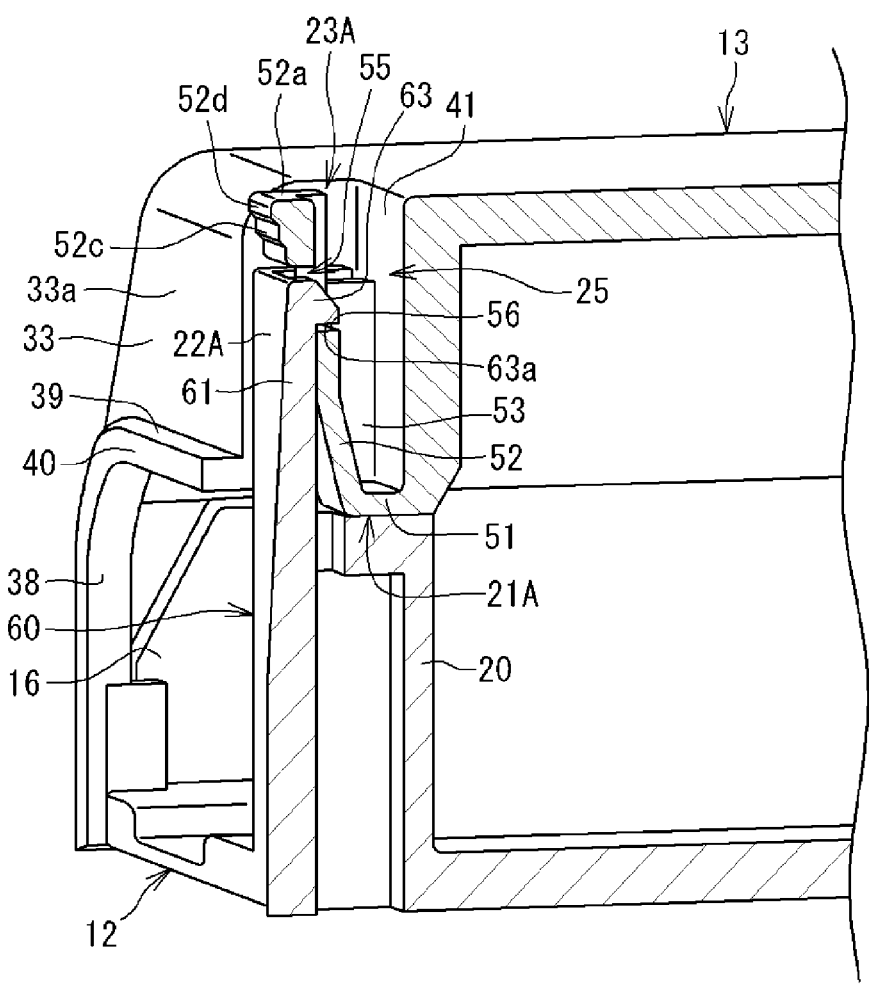
FIG. 6 is a cross-sectional view of the cover that is attached to a box main body at a predetermined position.

FIG. 6 is a cross-sectional view of the cover 13 attached to the box main body 12 at a predetermined position (hereinafter, referred to as an "attached state"). In the attached state, the projection 63 of the column part 60 serving as the first engaged part 22A is fitted into the hole 55 of the engaging piece part 52 included in the first engaging part 21A. When the projection 63 is fitted into the hole 55, the lower surface 63a of the projection 63 faces the inner surface 56 of the hole 55 in the up-down direction. If the cover 13 in the attached state attempts to be displaced, the inner surface 56 of the hole 55 comes into contact the projection 63 to restrict the upward displacement of the cover 13. In this manner, engagement between the projection 63 and the hole 55 prevents the cover 13 from coming loose from the box main body 12.

In order to disengage the projection 63 and the hole 55, the engaging piece part 52 is displaced rearward (toward the central side of the unit 70) using elastic deformation. When displacing the engaging piece part 52, an operator presses the operation part 52a backward using his/her finger.

The first lock part 23A is formed by the first engaging part 21A having the hole 55 and the first engaged part 22A having the projection 63 as described above. In the state where the first engaging part 21A and the first engaged part 22A are engaged with each other, the first lock part 23A is housed in the recessed part 25. As shown in FIG. 6, in the attached state, the projection 63 and the hole 55 are engaged with each other, and the coupling piece part 51 of the first engaging part 21A comes into contact with the central wall part 20 of the box main body 12 from above. Accordingly, the cover 13 is positioned on the box main body 12 in the up-down direction.

As shown in FIG. 3, the recessed part 25 has plate-shaped parts 53 that protrude forward from the bottom surface 41 on the right and left sides of the first engaging part 21A. In the attached state (see FIG. 7), the side parts 62a and 62b of the column part 60 are correspondingly positioned between the plate-shaped parts 53 and the side surfaces 42 of the recessed part 25. The plate-shaped parts 53 function as a finger guide in lock protection, positioning, and unlocking.

About Guide Functions of Cover 13 of Box Main Body 12

Referring to FIG. 2, the cover 13 is brought close to the box main body 12 from above, and the cover 13 is attached to the box main body 12. The box main body 12 has guide parts that guide the cover 13 during attachment. The guide part formed by a protruding ridge 66 provided protruding on a portion of the side plate part 16 of the box main body 12. The protruding ridge 66 is provided on both the right and left side plate parts 16. As guided parts that are guided by the protruding ridges 66, the cover 13 has the extension parts 65. In the attached state (see FIG. 1), the extension parts 65 partially cover the side plate parts 16 of the box main body 12 from the right and left sides.

When the cover 13 approaches the box main body 12 from above, the extension parts 65 come into contact with the protruding ridges 66, and the cover 13 covers the box main body 12 while being guided along the shape of the protruding ridges 66. Each protruding ridge 66 has a first part 67 that extends linearly in the up-down direction and a second part 68 that is continuous with the first part 67 and extends forward with increasing proximity to the lower side. With the protruding ridges 66, the cover 13 is first linearly guided downward by the first parts 67, and is then guided downward and forward by the second parts 68.

As a result of the extension parts 65 being guided along the first parts 67, the first engaging part 21A of the cover 13 is positioned rearward of the first engaged part 22A (the column part 60) of the box main body 12 with a gap therebetween in the front-back direction, and the cover 13 gradually approaches the box main body 12.

Then, the extension parts 65 are guided by the second parts 68, and thus the first engaging part 21A moves forward as it moves downward. Accordingly, the hole 55 of the first engaging part 21A approaches the projection 63 of the first engaged part 22A from behind, and eventually the hole 55 and the projection 63 engage with each other (see FIG. 6). When the hole 55 and the projection 63 engage with each other, the extension parts 65 are provided along the first parts 67 and the second parts 68 of the protruding ridges 66 (see FIG. 1).

In the electrical connection box 10 of the present embodiment, the first engaging part 21A (the hole 55) and the first engaged part 22A (the projection 63) are relatively displaced in the front-back direction for engagement.

The direction in which the protruding ridges 66 (the second parts 68) serving as the guide parts guide the extension parts 65 of the cover 13 has a front-back direction component. According to this configuration, when the cover 13 is placed on the box main body 12 while being guided by the protruding ridges 66, the first engaging part 21A and the first engaged part 22A engage with each other.

About Recessed Part 25

Figure 7:
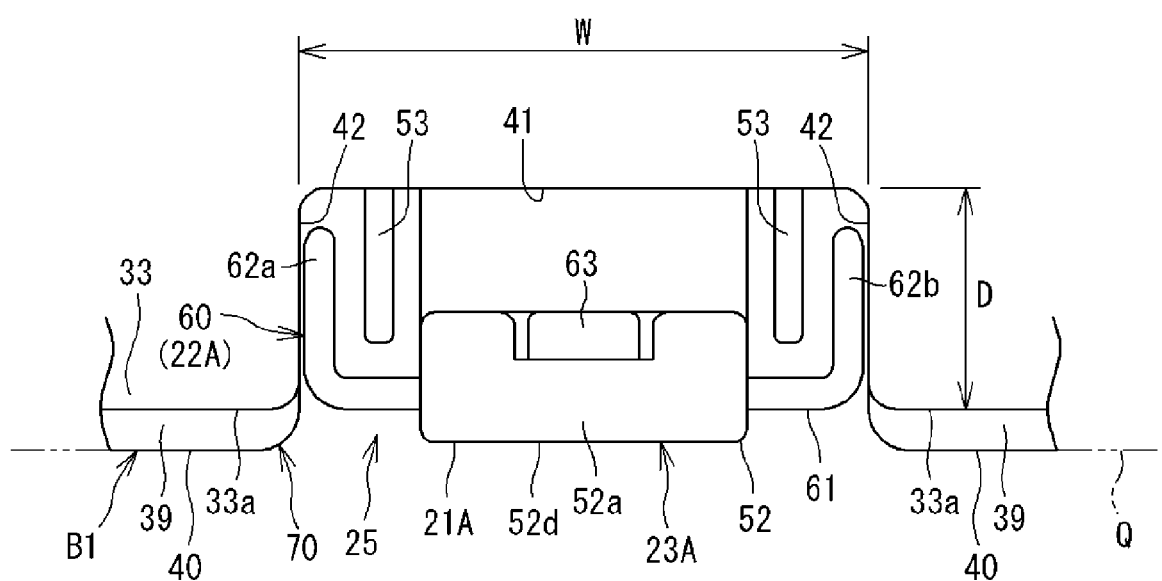
FIG. 7 is an enlarged plan view of a first lock part housed in a recessed part.
Figure 8:
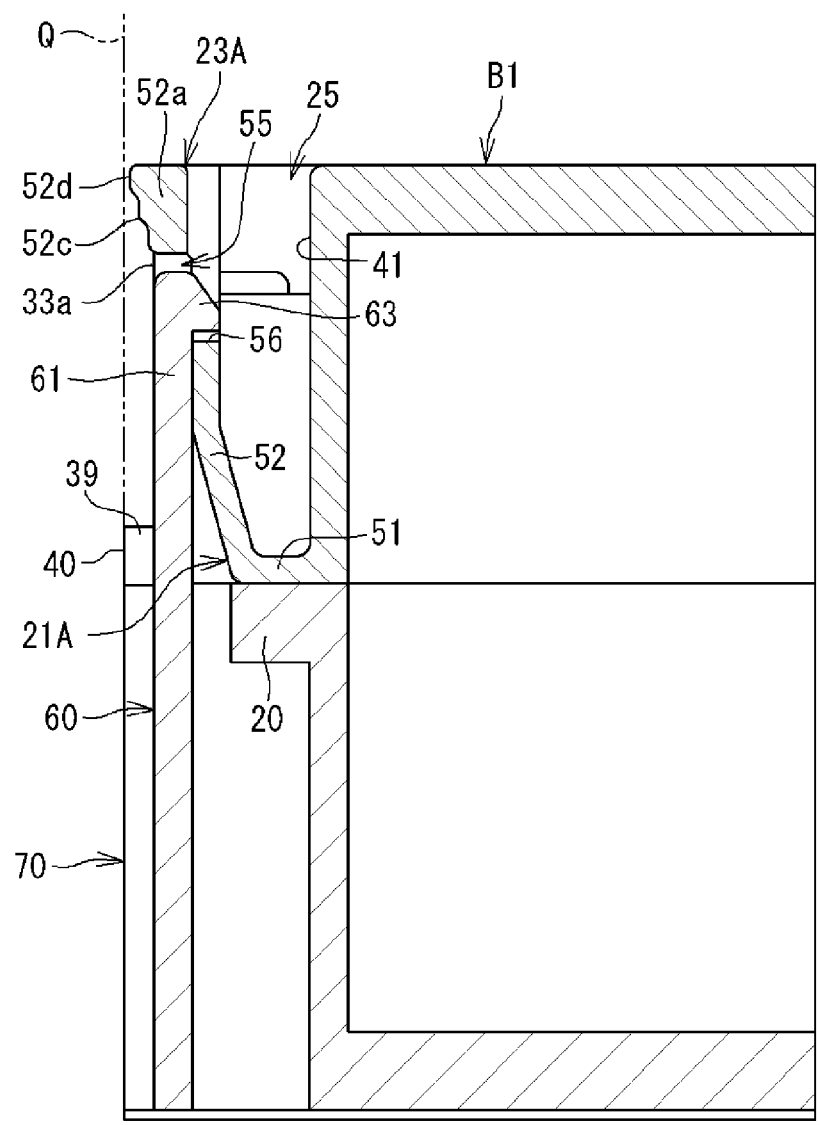
FIG. 8 is a cross-sectional view of the first lock part and its surroundings as viewed along the left-right direction.

The shape of the recessed part 25 will be further described. FIG. 7 is an enlarged plan view of the first lock part 23A housed in the recessed part 25. FIG. 8 is a cross-sectional view of the first lock part 23A and its surrounding region as viewed along the left right direction.

The electrical connection box 10 (see FIG. 1) is attached to the body frame of an automobile or the like, so as to fall within a preset required space. Thus, the first block B1 of the electrical connection box 10 is configured so as not to exceed a product boundary plane Q in the slightest (see FIGS. 7 and 8). The product boundary plane Q is a virtual plane that is orthogonal to the front-back direction, and is a plane that passes through the front end surface of the first block B1 of the electrical connection box 10. In the electrical connection box 10 of the present embodiment, as stated above, the cover front wall 33 has the ribs 39. Leading end surfaces 40 on the front side of the ribs 39 constitute the end surface that defines the product boundary plane Q. That is, the virtual plane that passes through the leading end surfaces 40 of the ribs 39 and expands in the left-right direction and the up-down direction constitutes the product boundary plane Q in the present embodiment.

In order to configure the first block B1 so as not exceed the product boundary plane Q in the slightest, the first lock part 23A is provided in the state of being housed in the recessed part 25. That is, the first lock part 23A is housed in the recessed part 25 such that the entire first lock part 23A is positioned closer to the central side of the unit 70 than the product boundary plane Q, that is, behind the product boundary plane Q.

For this end, the recessed part 25 has a predetermined depth dimension D in the front-back direction (see FIG. 7). That is, the recessed part 25 has the depth dimension D with which the first lock part 23A is positioned closer to the central side of the unit 70 than the leading end surfaces 40 of the ribs 39, that is, behind the leading end surfaces 40 of the ribs 39. The depth dimension D is a dimension from the front wall surface 33a of the cover front wall 33 to the bottom surface 41 of the recessed part 25 in the front-back direction.

The entire first lock part 23A is positioned behind the leading end surfaces 40 of the ribs 39. However, a portion of the first lock part 23A is positioned forward of the front wall surface 33a of the cover front wall 33. The portion positioned forward of the wall surface 33a is the operation part 52a of the engaging piece part 52 of the first engaging part 21A (see FIGS. 7 and 8). Specifically, as stated above, the operation part 52a (see FIG. 8) has the stepped operation surface 52c that extends forward with increasing proximity to the upper end of the engaging piece part 52. The foremost end surface 52d of the operation surface 52c is positioned forward of the wall surface 33a. Accordingly, the operation part 52a that is a portion of the first lock part 23A protrudes forward past the wall surface 33a.

The depth dimension D of the recessed part 25 will be further described. In the present embodiment, as stated above, in the attached state, the projection 63 of the column part 60 serving as the first engaged part 22A is engaged with the hole 55 of the engaging piece part 52 included in the first engaging part 21A. In order to disengage these components, the operation part 52a of the first engaging part 21A is pressed rearward to elastically deform the engaging piece part 52 rearward. The depth dimension D of the recessed part 25 is set to be greater than the dimension by which the engaging piece part 52 is displaced in order to achieve the disengagement as described above. Accordingly, in the range of the recessed part 25, the first engaging part 21A and the first engaged part 22A are disengaged from each other.

A width dimension W of the recessed part 25 (see FIG. 7) will be described. The width dimension W of the recessed part 25 is the distance between the right and left side surfaces 42. The recessed part 25 has the width dimension W that enables insertion of a person's fingertip (the tip of the index finger). The lower limit value of the width dimension W of the recessed part 25 is 20.1 millimeters, for example. The upper limit value of the width dimension W of the recessed part 25 is 21.1 millimeters, for example. Since the recessed part 25 has the width dimension W, the operator can disengage the first engaging part 21A and the first engaged part 22A using his/her fingertip without needing a tool.

About Second Lock Part 23B and Third Lock Part 23C

As stated above (see FIG. 1), the electrical connection box 10 includes, in addition to the first lock part 23A, the second lock part 23B provided on the back side of the first block B1, and the third lock part 23C provided on the front side of the second block B2. The cover 13 is fixed to the box main body 12 by engaging the first engaging part 21A and the first engaged part 22A that constitute the first lock part 23A, engaging the second engaging part 21B and the second engaged part 22B that constitute the second lock part 23B, and engaging the third engaging part 21C and the third engaged part 22C that constitute the third lock part 23C.

The third lock part 23C will be described. The third engaging part 21C has an engaging piece part 78 that elastically deforms in the front-back direction. The engaging piece part 78 is configured in a similar manner to the engaging piece part 52 of the first engaging part 21A of the first lock part 23A. The third engaged part 22C (see FIG. 2) has a projection 77 that engages with a hole 79 of the engaging piece part 78. The projection 77 is provided at a front part 76 of the third engaged part 22C. The front part 76 and the projection 77 are configured in a similar manner to the front part 61 and the projection 63 of the first engaged part 22A (see FIG. 5) of the first lock part 23A.

In the present embodiment (see FIG. 1), a second recessed part 80 is formed in the third side wall part 48 of the outer peripheral wall 30 of the cover 13, and the third lock part 23C is housed in the second recessed part 80. However, a portion of the third lock part 23C protrudes forward from the front end surface of the third side wall part 48. This is because no wire harness or the like is provided in the surrounding region of the third lock part 23C and there is no risk of interference with other components.

The second recessed part 80 has a width dimension that enables insertion of a person's fingertip and that is larger than the width dimension of the recessed part 25 (the first recessed part 25) provided in the cover front wall 33. The two wire harnesses 91 and 91 need to be provided in a space-saving manner in the left-right direction, on the right and left sides of the first recessed part 25. Accordingly, the width dimension of the first recessed part 25 is set to the minimum width dimension that enables insertion of a person's fingertip. In contrast to this, the second recessed part 80 has no wire harness on two sides. Thus, in order to enhance the operability of the engaging piece part 78 and increase the reliability of the engagement, the third lock part 23C is larger than the first lock part 23A in the left-right direction. According to this, the second recessed part 80 has a larger width dimension than the first recessed part 25.

The second lock part 23B will be described. The second engaging part 21B and the second engaged part 22B face the opposite side to the third engaging part 21C and the third engaged part 22C of the third lock part 23C in the front-back direction, but have the same shape as the third engaging part 21C and the third engaged part 22C. The second lock part 23B is not housed in a recessed part formed in a portion of the outer peripheral wall 30 of the cover 13 and protrudes backward from a portion of the outer peripheral wall 30. This is because no wire harness or the like is provided in the surrounding region of the second lock part 23B and there is no risk of interference with other components.

In this manner, the electrical connection box 10 of the present embodiment has the plurality of (three) lock parts 23A, 23B, and 23C, and only the first lock part 23A is housed in the recessed part 25 so as to be positioned closer to the central side (back side) of the unit 70 than the end surface (the product boundary plane Q) of the outer peripheral wall 30.

About Electrical Connection Box 10 of Present Embodiment

The electrical connection box 10 of the present embodiment includes the box main body 12 that is provided with the busbar 11 and the cover 13 that covers the box main body 12.

The cover 13 has the first engaging part 21A, and the box main body 12 has the first engaged part 22A that is engaged with the first engaging part 21A to combine the box main body 12 and the cover 13. The recessed part 25 is formed in a portion of the outer peripheral wall 30 of the unit 70 that is formed by combining the box main body 12 and the cover 13. The recessed part 25 houses the first lock part 23A that is formed by engaging the first engaging part 21A and the first engaged part 22A with each other. The recessed part 25 has the depth dimension D (see FIG. 7) with which the first lock part 23A is positioned closer to the central side (that is, the back side) of the unit 70 than the end surface of the outer peripheral wall 30 (the leading end surfaces 40 of the ribs 39).

According to the electrical connection box 10 including the configuration described above, the first lock part 23A is housed in the recessed part 25 of the outer peripheral wall 30 of the unit 70. In addition, the first lock part 23A does not protrude from the end surface of the outer peripheral wall 30. In the present embodiment, as stated above, the end surface of the outer peripheral wall 30 is the leading end surfaces 40 of the ribs 39. The virtual plane including the leading end surfaces 40 is the product boundary plane Q (see FIGS. 7 and 8). The first lock part 23A does not protrude past the product boundary plane Q.

In the present embodiment, the two wire harnesses 91 extend from the cover front wall 33 that is a portion of the outer peripheral wall 30. The opening 38 that allows passage of the wire harnesses 91 therethrough is formed on the right and left sides of the cover front wall 33 with the recessed part 25 in between. Accordingly, the member that is likely to interfere with the first lock part 23A is the protector 92 provided on the wire harnesses 91. The protector 92 is not attached at a determined position. However, according to the electrical connection box 10 of the present embodiment, it is possible to suppress interference with the protector 92.

In the present embodiment, the opening 38 that allows passage of the two wire harnesses 91 on two sides of the recessed part 25. This allows the two wire harnesses 91 and the recessed part 25 to be arranged in a spatially efficient manner.

As stated above, the first lock part 23A does not protrude from the end surface of the outer peripheral wall 30 (the leading end surfaces 40 of the ribs 39) toward the outside (front side) of the unit 70. That is, the first lock part 23A does not protrude at all from the product boundary plane Q toward the outside (front side) of the unit 70.

However, as shown in FIG. 8, a portion of the first lock part 23A protrudes toward the outside (front side) of the unit 70 past the front wall surface 33a of the cover front wall 33. The portion of the first lock part 23A protruding from the wall surface 33a is the front end portion of the operation part 52a of the engaging piece part 52 of the first engaging part 21A.

That is, the front end portion of the operation part 52a is positioned between the front wall surface 33a of the cover front wall 33 and the leading end surfaces 40 of the ribs 39 in the front-back direction.

In this manner, since the front end portion of the operation part 52a protrudes forward from the front wall surface 33a of the cover front wall 33, an operator can easily access the operation part 52a by moving a finger along the wall surface 33a when removing the cover 13 from the box main body 12 in an environment where the operation part 52a is not visible, for example.

OTHERS

In the embodiment described above, the number of lock parts for attaching the cover 13 to the box main body 12 is three. However, this number can be changed. In this case as well, the first lock part 23A near the wire harnesses 91 is configured as described above.

The embodiments described above are illustrative and are not limitative in all respects. It should be noted that the scope of rights in the present disclosure is not indicated by the embodiments described above, but is indicated by the claims, and is intended to include all modifications within a meaning and scope equivalent to the claims.

The invention claimed is:

1. An electrical connection box comprising:
   a busbar;
   a box main body in which the busbar is provided; and
   a cover that covers the box main body,
   wherein the cover has an engaging part,
   the box main body has an engaged part that is engaged with the engaging part to combine the box main body and the cover,
   a recessed part is formed in an outer peripheral wall of a unit that is formed by combining the box main body and the cover, the recessed part housing a lock part that is formed by engagement between the engaging part and the engaged part, and
   the recessed part has a depth dimension with which the lock part is positioned closer to a central side of the unit than an end surface of the outer peripheral wall,
   wherein an opening that enables passage of two cables is formed on two sides of the recessed part in a portion of the outer peripheral wall, such that the two cables extend from the portion of the outer peripheral wall provided with the recessed part in a direction in which the portion of the outer peripheral wall is oriented.

2. The electrical connection box according to claim 1, wherein the lock part is configured to displace the engaging part toward the central side of the unit in order to disengage the engaging part and the engaged part, and
   the recessed part has a depth dimension that is greater than a dimension by which the engaging part is displaced for the disengagement.

3. The electrical connection box according to claim 2, wherein the recessed part has a width dimension that enables insertion of a person's fingertip.

4. The electrical connection box according claim 2,
   wherein, if the cover covers the box main body from above, the box main body has a guide part that guides the cover when the cover is brought close to and is attached to the box main body from above,
   the engaging part and the engaged part are configured to be relatively displaced for engagement in a direction orthogonal to an up-down direction, and
   a direction in which the guide part guides the cover has a component of a direction orthogonal to the up-down direction.

5. The electrical connection box according to claim 1, wherein the recessed part has a width dimension that enables insertion of a person's fingertip.

6. The electrical connection box according to claim 5,
   wherein, if the cover covers the box main body from above, the box main body has a guide part that guides the cover when the cover is brought close to and is attached to the box main body from above,
   the engaging part and the engaged part are configured to be relatively displaced for engagement in a direction orthogonal to an up-down direction, and
   a direction in which the guide part guides the cover has a component of a direction orthogonal to the up-down direction.

7. The electrical connection box according to claim 1, wherein the cover has a rib that protrudes from the outer peripheral wall provided with the opening and is provided along the opening, and a leading end surface of the rib is the end surface.

8. The electrical connection box according to claim 7, wherein at least a portion of the lock part protrudes toward the outside of the unit past a wall surface of the outer peripheral wall.

9. The electrical connection box according to claim 8,
wherein, if the cover covers the box main body from above, the box main body has a guide part that guides the cover when the cover is brought close to and is attached to the box main body from above, the engaging part and the engaged part are configured to be relatively displaced for engagement in a direction orthogonal to an up-down direction, and a direction in which the guide part guides the cover has a component of a direction orthogonal to the up-down direction.

10. The electrical connection box according to claim 7,
wherein, if the cover covers the box main body from above, the box main body has a guide part that guides the cover when the cover is brought close to and is attached to the box main body from above, the engaging part and the engaged part are configured to be relatively displaced for engagement in a direction orthogonal to an up-down direction, and a direction in which the guide part guides the cover has a component of a direction orthogonal to the up-down direction.

11. The electrical connection box according to claim 1, wherein, if the cover covers the box main body from above, the box main body has a guide part that guides the cover when the cover is brought close to and is attached to the box main body from above, the engaging part and the engaged part are configured to be relatively displaced for engagement in a direction orthogonal to an up-down direction, and a direction in which the guide part guides the cover has a component of a direction orthogonal to the up-down direction.

* * * * *